(12) United States Patent
Brontvein et al.

(10) Patent No.: US 11,264,203 B1
(45) Date of Patent: Mar. 1, 2022

(54) REDUCING A TEMPERATURE DIFFERENCE BETWEEN A SAMPLE AND A CHUCK OF AN ELECTRON BEAM TOOL

(71) Applicant: Applied Materials Israel Ltd., Rehovot (IL)

(72) Inventors: Genadi Gabi Brontvein, Rehovot (IL); Avraham Aboody, Ramat Gan (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 16/995,058

(22) Filed: Aug. 17, 2020

(51) Int. Cl.
 *H01J 37/28* (2006.01)
 *H01J 37/20* (2006.01)
 *H01L 21/687* (2006.01)

(52) U.S. Cl.
 CPC ............. *H01J 37/28* (2013.01); *H01J 37/20* (2013.01); *H01L 21/687* (2013.01)

(58) Field of Classification Search
 CPC .......... H01J 37/00; H01J 37/02; H01J 37/023; H01J 37/16; H01J 37/18; H01J 37/18528; H01J 37/20; H01L 21/687
 USPC ............... 250/306, 307, 311, 440.11, 441.11
 See application file for complete search history.

(56) References Cited

U.S. PATENT DOCUMENTS

| | | | |
|---|---|---|---|
| 6,388,263 B1* | 5/2002 | Song | H01J 37/18 250/492.21 |
| 2007/0228275 A1* | 10/2007 | Fuse | H01J 37/1474 250/310 |
| 2015/0235805 A1* | 8/2015 | Gardiner | H01J 37/261 436/163 |
| 2015/0340198 A1* | 11/2015 | Nakagawa | H01L 21/67248 250/441.11 |
| 2015/0371814 A1* | 12/2015 | Kanno | H01L 21/67248 250/443.1 |
| 2020/0144019 A1* | 5/2020 | Van Heumen | H01J 37/20 |

* cited by examiner

*Primary Examiner* — Jason L McCormack
(74) *Attorney, Agent, or Firm* — Kilpatrick Townsend & Stockton LLP

(57) ABSTRACT

A method, a non-transitory computer readable medium and a system for reducing a temperature difference between a sample and a chuck of an electron beam tool. The method may include determining a target temperature of samples located at the load port of the electron beam tool; setting a temperature of the samples, located at the load port, to the target temperature; moving the sample from the load port to the chuck, the chuck is located within a vacuum chamber, the sample belongs to the samples; and positioning the sample on the chuck, wherein when positioned on the chuck, a temperature of the sample substantially equals a temperature of the chuck.

15 Claims, 3 Drawing Sheets

REDUCING A TEMPERATURE DIFFERENCE BETWEEN A SAMPLE AND A CHUCK OF AN ELECTRON BEAM TOOL

BACKGROUND

A scanning electron microscope is a high-resolution tool for evaluating a sample such as a semiconductor wafer.

There are different types of scanning electron microscopes—including a review scanning electron microscope that is used to review suspected defects, and a critical dimension scanning electron microscope that is used to measure critical dimensions of microscopic structures of the sample.

In each scanning electron microscope, a sample is evaluated while positioned within a vacuum chamber of the scanning electron microscope.

The sample is supported by a chuck. The chuck is moved by a mechanical stage. The mechanical stage includes engines and other components that may heat during the movement—thereby heating the chuck.

A scanning electron microscope should exhibit a nanometric scale resolution. This nanometric scale resolution is obtained by scanning an area of the sample with an electron beam that has a very small cross section. Multiple areas of the samples may be scanned—usually one area after the other.

The area of the sample is expected to include nanometric scale features of interest. For example—the nanometric scale features of interest may suffer from suspected defects. Additionally or alternatively, the nanometric scale features of interest may be features that should be measured.

Before scanning the area, the mechanical stage may move the sample so that the area is located within the field of view of the electron beam.

The position of the electron beam should be very accurate—in order to scan the nanometric scale features of interest.

Due to the heating of the chuck—there may be a significant temperature difference between the chuck and the sample—so that when the sample is positioned on the chuck—the sample may be slightly deformed.

The deformation of the sample may introduce intolerable position errors.

There is a growing need to effectively reduce the significant temperature difference between the chuck and the sample.

SUMMARY

There may be provided a method, a non-transitory computer readable medium and a detection system for reducing a temperature difference between the chuck and a sample.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
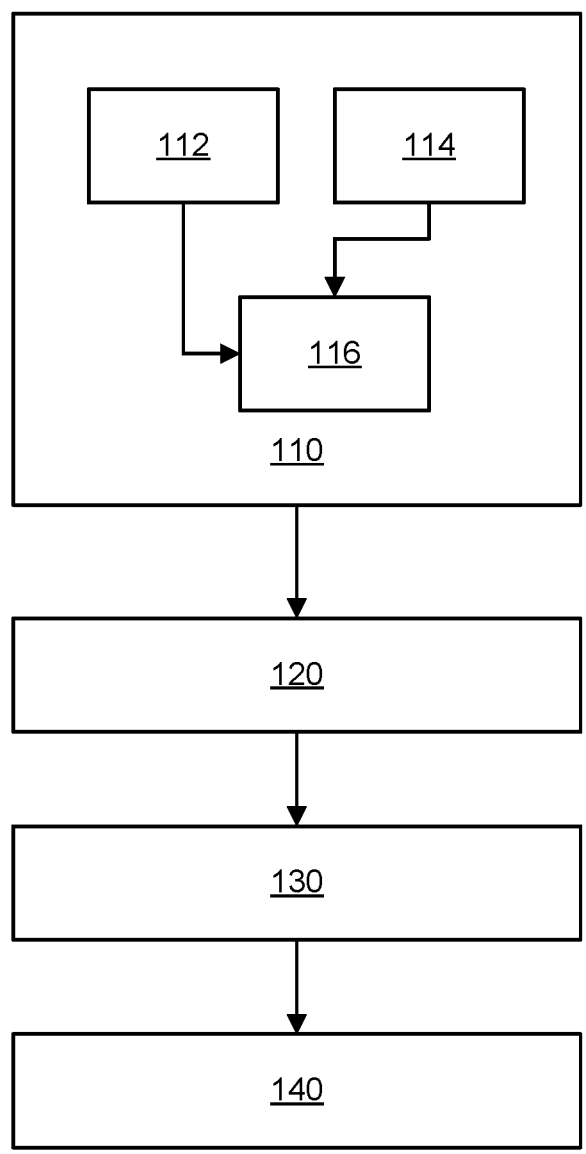
FIG. 1 illustrates an example of a method.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure Any reference in the specification to a method should be applied mutatis mutandis to a system capable of executing the method and should be applied mutatis mutandis to a computer readable medium that is non-transitory and stores instructions for executing the method.

Any reference in the specification to a system should be applied mutatis mutandis to a method that may be executed by the system and should be applied mutatis mutandis to a computer readable medium that is non-transitory and stores instructions executable by the system.

Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium.

The term "and/or" means additionally or alternatively.

The term "electron beam tool" refers to a tool that may generate one or more electron beams and scan a sample (or an area of the sample) with the one or more electron beams. A scanning electron microscope is a non-limiting example of an electron beam tool.

FIG. 1 illustrates method 100 for reducing a temperature difference between a sample and a chuck of an electron beam tool.

Method 100 may start by step 110 of determining a target temperature of samples located at the load port of the electron beam tool.

The phrase "samples located at the load port" may include samples that are located within the load port, samples that are supported by the load port, samples that are positioned on the load port, samples that are located within a samples holder located within the load port, samples that are located in a samples holder that is supported by the load port, samples that are located in a samples holder that is positioned on the load port, and the like.

Step 110 may include step 112 of monitoring the temperature of the chuck.

The temperature of the chuck may change over time. On one hand, a movement of the mechanical stage may heat the chuck. On the other hand, the temperature of the chuck may decrease between one movement to another.

The monitoring should track the temperature changes—or at least the temperature during relevant time windows. A relevant time window may precede the provision of each one of the samples to the chuck.

The monitoring may include measuring the temperature or one or more locations of the chuck. The monitoring may include measuring the temperature or one or more locations that are thermally coupled to the chuck or any location having a known temperature relationship with the chuck. The measuring of the temperature may be executed in a continuous manner, in non-continuous manner, and the like.

The temperature may be monitored, for example, before one or more of the samples are sent to the chuck. The monitoring may occur enough time before the sending of a sample to the chuck so that the temperature of the sample may be set to the target temperature before being sent.

The temperature of the chuck may be estimated without monitoring the temperature. For example, the estimating of the temperature of the chuck may be based on simulation of the temperature, or on any other estimation of the expected temperature changes of the chuck due to movements.

Step 110 may also include step 116. Step 112 may be followed by step 116 of determining the target temperature based on the outcome of step 112.

Step 116 may be also responsive to a temperature change of the sample during a movement of the sample from the load port to the chuck. The temperature change may be monitored, may be estimated or may be calculated in any other manner. The temperature of the sample is expected to decrease during the transfer of the sample from the samples holder to the chuck.

Step 110 may also include step 114 of monitoring a change of a temperature of the sample during a movement of the sample from the load port to the chuck. This may include providing temperature measurements from different locations along the path of the sample.

When step 114 is executed, step 116 is also responsive to the outcome of step 114.

Step 110 may be followed by step 120 of setting a temperature of the samples, located at the load port, to the target temperature.

The setting of the temperature of the multiple samples (while the samples are located at the load port) prevents a bottle neck or any delay introduced by setting the temperature of a sample only when the sample is moved to the wafer chamber.

Step 120 increases the throughput of the system by removing delays in the serial provisioning of a single sample to the chuck.

Step 120 may include flowing gas having a controlled temperature towards the samples within the samples holder.

The samples may be located within a samples holder while positioned at the load port. The samples holder may be a cassette, a front opening united pod (FOUP), and the like.

Step 120 may include providing gas of controlled temperature to one or more gas distributers of the samples holder. A gas distributer may include a gas conduit and an inlet and multiple outlets that are located at different heights and/or at different locations along the width of the gas distributer. The inlet may be selectively closed by a value of any other gas flow control element.

Step 120 may include providing gas of controlled temperature to one or more gas distributers positioned outside the samples holder—for example positioned in the sample transfer unit.

Step 120 may be followed by step 130 of moving a sample (out of the samples) from the load port to the chuck. The chuck is located within a vacuum chamber. The sample is taken from the samples holder.

The moving of the sample may include (a) moving the sample to a load lock (for example by an automated materials handling system—such as a robot of a sample transfer unit), and (b) moving the sample from the load lock to the vacuum chamber.

Step 130 may be followed by step 140 of positioning the sample on the chuck, wherein when positioned on the chuck, a temperature of the sample substantially equals a temperature of the chuck.

Step 140 may be followed by evaluating the sample during an evaluation period. The evaluating may include at least one out of reviewing the sample, measuring dimensions (such as critical dimensions) of the sample, and the like. The temperature of the chuck may be monitored during at least some points in time of the evaluation period.

The temperature of the sample may be regarded as being substantially equal to the temperature of the chuck when a temperature difference between the temperature of the sample and the temperature of the chuck is (a) below a temperature threshold—for example below 0.5 degrees Celsius, and additionally or alternatively, (b) is of a value that introduces a sample distortion that is below a sample distortion threshold—for example below 100 nanometers. Values other than 0.5 degrees Celsius and 100 nanometers may be provided.

Steps 110, 120, 130 and 140 may be repeated multiple times. During each repetition one or more samples are moved from the load port to the chuck. For example—if each repetition of steps 110, 120, 130 and 140 is associated with a single sample—then multiple repetitions are executed for the multiple samples in the load port.

After an evaluation of a sample ends—the sample may be sent back to the load port.

There may be provided a system for reducing a temperature difference between a sample and a chuck of an electron beam tool. The system may be the electron beam tool, the system may be included in the electron beam tool, or the system may have at least one unit that is added to an electron beam tool.

Figure 2:
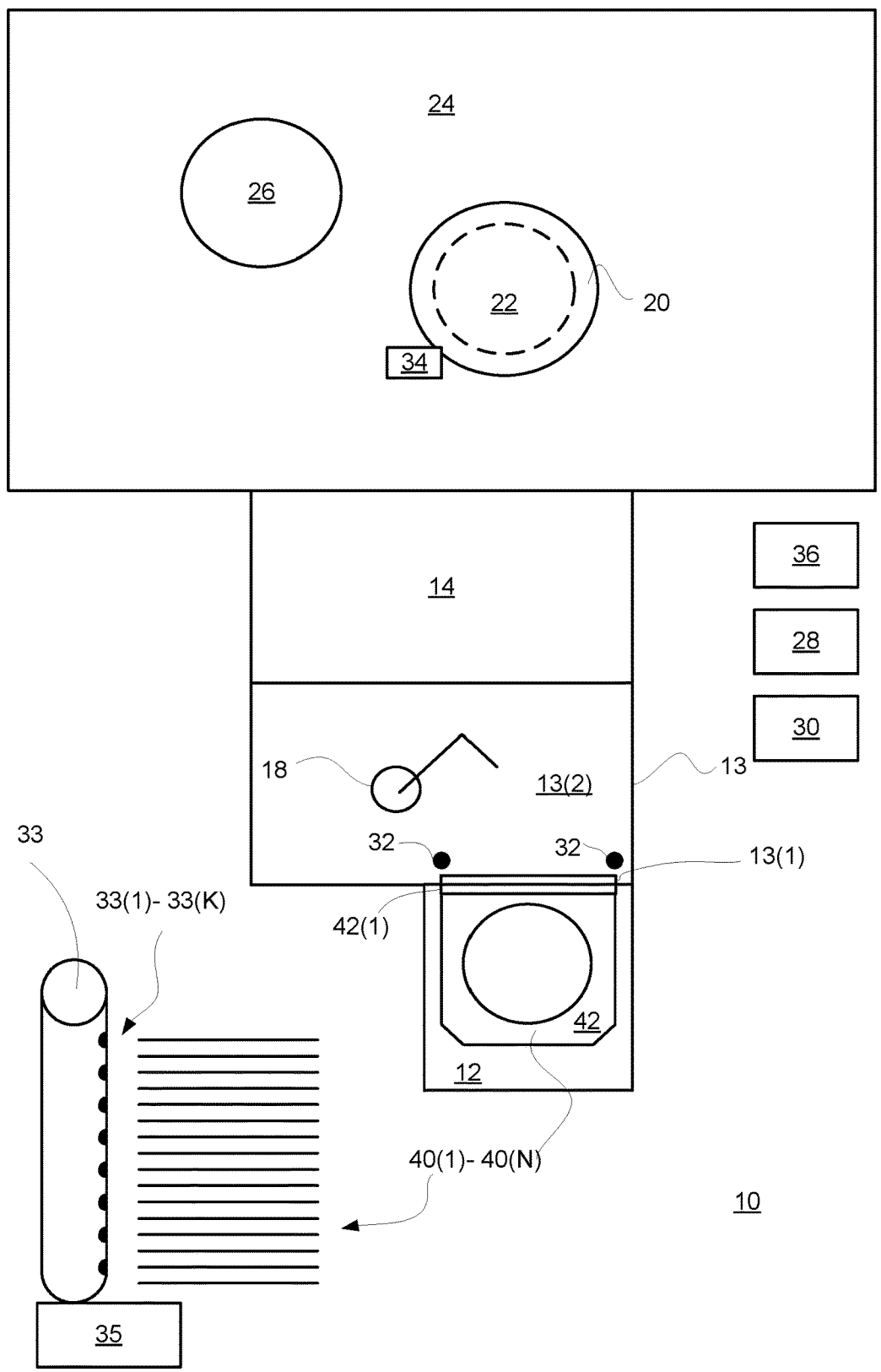
FIG. 2 illustrates an example of an electron beam system.
Figure 3:
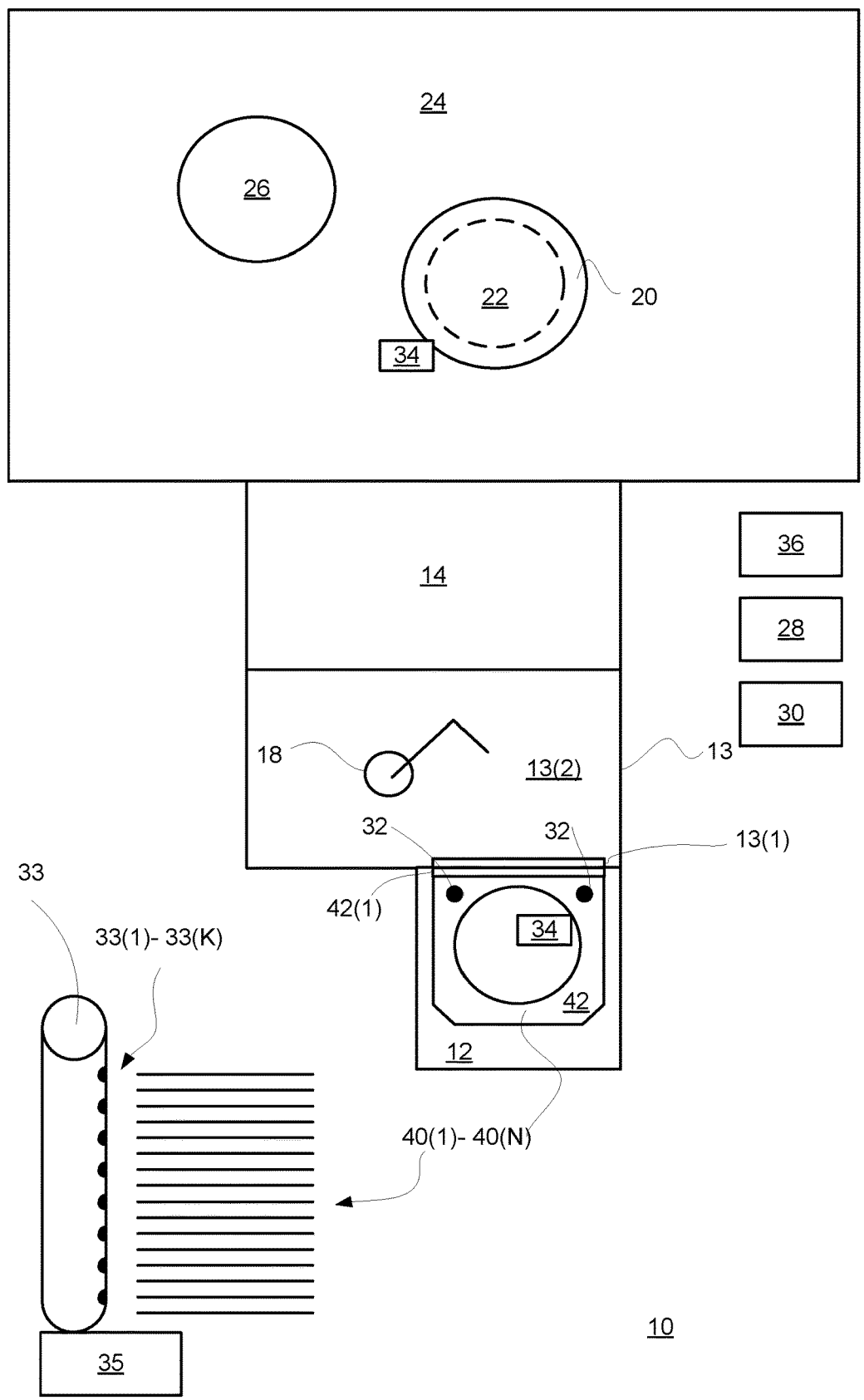
FIG. 3 illustrates an example of an electron beam system.

FIGS. 2 and 3 illustrate examples of an electron beam tool 10.

In FIGS. 2 and 3 it is assumed that the system is included in electron beam tool 10.

Electron beam tool 10 includes a load port 12, a sample transfer unit 13, a load lock 14, a movement mechanism that may include automated materials handling system 18, a chuck 20, a mechanical stage 22, a vacuum chamber 24, an electron beam column 26, a controller 28, a processor 30, one or more temperature control units 32, one or more temperature sensors 34, and a monitor 36.

Samples 40(1)-40(N) may be held in samples holder 42. N is an integer that exceed one. A single sample is denoted 42(n), n ranges between 1 and N.

The samples holder 42 may be positioned at the load port 12. The load port 12 or rather the samples holder 42 interfaces with the sample transfer unit 13 via a door 13(1) of the sample transfer unit 13.

The door 13(1) may be closed to define an inner space 13(2) of the sample transfer unit.

The samples holder 42 may include a housing that may include a samples holder door 42(1) that may be positioned in front of door 13(1).

The housing may provide a closed environment that may be exposed to door 13(1) when the samples holder door 42(1) is opened.

A sample may be taken from the samples holder 42 or returned to the samples holder 42 through door 13(1), and through samples holder door 42(1).

The temperature of the samples within the samples holder 42 may be set by setting the temperature within at least a part of the sample transfer unit 13—especially by directing gas of controlled temperature to flow through door 13(1) and then through samples holder door 42(1).

In FIG. 2, the one or more temperature control units 32 are positioned outside the samples holder 42—and are located within the sample transfer unit 13, facing door 13(1).

FIG. 2 also illustrates a side view of a temperature control unit that includes a gas distributer such as a pipe 33 with multiple apertures 33(1)-33(K) that may be positioned to face samples 40(1)-42(N). N may equal K. K may be smaller than N. For example—K may be equal a half of N. K may exceed N. The pipe 33 may be fed with gas by an external gas supply unit 35. The apertures may form a column, may for a two-dimensional array, may be located at different heights and positioned at different width coordinates of the pipe.

The automated materials handling system 18 may be configured to move a sample 40(n), from the samples holder 42 to the load lock 14.

The load lock 14 is configured to receive the sample, introduce a desired vacuum level within the load lock 14, and then expose the sample 40(n) to the vacuum chamber 24.

A robot or other mechanical unit (not shown) may move the sample from the load lock 14 to the chuck 20. Chuck 20 is supported by a mechanical stage 22, is moved within the vacuum chamber by mechanical stage 22, and is heated by mechanical stage 22.

In FIG. 2 the one or more temperature sensors 34 are illustrates as being a single temperature sensor that is thermally coupled to the chuck 20 and is configured to measure the temperature of the chuck 20.

The temperature of the chuck may be estimated based on measurements taken from one or more sensors located at one or more locations.

It should be noted that the one or more temperature sensors 34 may measure the temperature of at least one of the mechanical stage 22, the load lock 14, the sample 40(n), the samples holder 42, of the load port 12, and the like.

Temperature measurements of any temperature sensor may be fed to monitor 36. The monitor 36 may determine the temperature of the chuck and send temperature information regarding the temperature of the chuck to controller 28.

Controller 28 may determine, based on the temperature information, the target temperature of the samples within the samples holder.

It should be noted that the controller 28 and the monitor 36 may be merged—or that that the temperature monitoring task may be executed, at least in part, by the controller 28.

The temperature is set so that the temperature of the chuck (when the sample 40(n) is positioned on the chuck) substantially equals the temperature of the sample 40(n) (when positioned on the chuck). The temperature of the chuck should be substantially equal to the target temperature of the sample minus the temperature change introduced by the movement of sample 40(n) from the samples holder to the chuck.

The chuck may be hotter than the sample within the samples holder (when no temperature setting is applied within the samples holder 42). The setting of the temperature usually involves heating the samples in the samples holder.

Nevertheless—the temperature of the chuck changes and may decrease during some time windows—usually after the mechanical stage stops moving. In such cases, the target temperature of the samples may be lowered.

In FIG. 3, the one or more temperature control units 32 are included in the samples holder.

FIG. 3 also illustrates a gas distributer such as a pipe 33 with multiple apertures 33(1)-33(K) that is included in the samples holder. The pipe may be fed by an external gas supply unit 35 that is located outside the samples holder.

In FIG. 3 the one or more temperature sensors 34 are illustrates as including (a) a temperature sensor that is thermally coupled to the chuck 20 and is configured to measure the temperature of the chuck 20, and (b) another temperature sensor that is configured to sense the temperature of the samples in the samples holder.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

We claim:

1. A method for reducing a temperature difference between a sample and a chuck of an electron beam tool, the method comprising:
monitoring a temperature of the chuck using a first temperature sensor that is thermally coupled to the chuck and configured to sense the temperature of the chuck;
determining a target temperature of the sample located at a load port of the electron beam tool in a sample holder;
setting a temperature of the sample, located at the load port, to the target temperature;
monitoring the temperature of the sample using a second temperature sensor that is configured to sense the temperature of the sample in the sample holder;
moving the sample from the load port to the chuck, the chuck located within a vacuum chamber; and
positioning the sample on the chuck, wherein when positioned on the chuck, the temperature of the sample substantially equals a temperature of the chuck.

2. The method according to claim 1, wherein determining the target temperature is based on the temperature of the chuck and on a temperature change of the sample during a movement of the sample from the load port to the chuck.

3. The method according to claim 2, wherein moving the sample from the load port to the chuck includes monitoring the temperature change of the sample during movement of the sample from the load port to the chuck.

4. The method according to claim 1, wherein the sample is a first sample, further comprising moving a second sample from the load port to the chuck; and
positioning the second sample on the chuck, wherein when positioned on the chuck, a temperature of the second sample substantially equals a temperature of the chuck.

5. The method according to claim 4, wherein moving the second sample from the load port to the chuck includes determining the target temperature after moving the first sample and before moving the second sample.

6. The method according to claim 1, wherein setting the temperature comprises flowing gas having a controlled temperature in the sample holder.

7. The method according to claim 1, wherein the sample is located within the sample holder while positioned at the load port, wherein setting the temperature includes providing gas with a controlled temperature to one or more gas distributers of the sample holder.

8. The method according to claim 7, wherein the one or more gas distributers include an inlet and a plurality of outlets that are located at different heights.

9. The method according to claim 1, wherein the sample is located within the sample holder while positioned at the load port, wherein setting the temperature includes providing gas with a controlled temperature to one or more gas distributers positioned outside the sample holder.

10. A system for reducing a temperature difference between a sample and a chuck of an electron beam tool, the system comprising:
a temperature sensor that is thermally coupled to the chuck and configured to sense a temperature of the chuck;
a controller that is configured to determine a target temperature of the sample located at a load port of the electron beam tool;
one or more temperature control units that are configured to set a temperature of the sample, located at the load port, to the target temperature by flowing gas with a controlled temperature into a sample holder;
a movement mechanism that is configured to:
move the sample from the load port to the chuck, the chuck located within a vacuum chamber; and position the sample on the chuck, wherein when positioned on the chuck, a temperature of the sample substantially equals a temperature of the chuck.

11. The system according to claim 10, further comprising a monitor that is configured to monitor the temperature of the chuck.

12. The system according to claim 10, wherein the controller is configured to determine the target temperature based on the temperature of the chuck and on a temperature change of the sample during a movement of the sample from the load port to the chuck.

13. The system according to claim 10, wherein the sample is located within the sample holder while positioned at the load port, wherein the one or more temperature control units include one or more gas distributers of the samples holder.

14. The system according to claim 10, wherein the sample is located within the sample holder while positioned at the load port, wherein the one or more temperature control units include one or more gas distributers positioned outside the sample holder.

15. A non-transitory computer readable medium that stores instructions that, when executed by a processor, perform steps comprising:

monitoring a temperature of a chuck using a first temperature sensor that is thermally coupled to the chuck and configured to sense the temperature of the chuck;

determining a target temperature of a sample located at a load port of an electron beam tool in a sample holder using a second temperature sensor that is configured to sense the temperature of the sample in the sample holder;

controlling a setting of a temperature of the sample, located at the load port, to the target temperature by flowing gas with a controlled temperature into a sample holder;

controlling a move of the sample from the load port to a chuck, the chuck located within a vacuum chamber; and controlling a positioning of the sample on the chuck, wherein when positioned on the chuck, a temperature of the sample substantially equals a temperature of the chuck.

* * * * *